(12) United States Patent
Henson et al.

(10) Patent No.: US 7,254,244 B2
(45) Date of Patent: Aug. 7, 2007

(54) POP AND CLICK REDUCTION USING DAC POWER UP AND POWER DOWN PROCESSING

(75) Inventors: Matthew Brady Henson, Austin, TX (US); Matthew D. Felder, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 62 days.

(21) Appl. No.: 10/628,827

(22) Filed: Jul. 28, 2003

(65) Prior Publication Data

US 2005/0025322 A1  Feb. 3, 2005

(51) Int. Cl.
*H03F 21/00* (2006.01)
*H03F 1/14* (2006.01)
*H03F 1/26* (2006.01)
*H04B 15/00* (2006.01)
*H03G 3/10* (2006.01)

(52) U.S. Cl. .................. 381/120; 381/94.5; 330/51; 330/149; 330/279

(58) Field of Classification Search .............. 381/120, 381/94.5; 330/279, 51, 149
See application file for complete search history.

(56) References Cited

U.S. PATENT DOCUMENTS

| | | | | |
|---|---|---|---|---|
| 5,764,005 A | * | 6/1998 | Kobayashi | 315/382 |
| 5,796,851 A | * | 8/1998 | Hewitt et al. | 381/94.5 |
| 6,281,821 B1 | * | 8/2001 | Rhode et al. | 341/144 |
| 6,783,073 B2 | * | 8/2004 | Yahagi et al. | 235/462.28 |

* cited by examiner

*Primary Examiner*—Vivian Chin
*Assistant Examiner*—Devona E. Faulk
(74) *Attorney, Agent, or Firm*—Garlick Harrison & Markison; Timothy W. Markison; Bruce E. Stuckman

(57) ABSTRACT

An audio amplifier generates an output to a load, in which a digital-to-analog converter drives the amplifier during powering up and powering down the amplifier. The digital-to-analog converter controls the amplifier to ramp the voltage at the output at a predetermined rate to reduce rapid voltage changes from being sent to the load during the powering up or powering down sequence.

16 Claims, 7 Drawing Sheets

POP AND CLICK REDUCTION USING DAC POWER UP AND POWER DOWN PROCESSING

BACKGROUND OF THE INVENTION

1. Field of the Invention

The embodiments of the invention relate to amplifiers and, more particularly, to power up processing and power down processing of an amplifier.

2. Description of Related Art

Integrated circuit amplifiers perform a variety of tasks including the use of an amplifier to drive low impedance loads. One particular type of output amplifier is used to drive a low frequency signal to a low impedance load. One such example is an output amplifier used to drive an audio signal to a low impedance load such as a headphone. In a typical arrangement, to pass low frequency signals to the low impedance load, a direct current (DC) blocking capacitor may be employed between the amplifier and the load in order to block the DC voltage. In order to ensure reasonable bass response for an audio amplifier, the capacitance value of the blocking capacitor tends to be large. For example, in order to pass audio signals of 20 Hz or greater to a low impedance headphone load (approximately 16 Ohms), it is not unreasonable to find DC blocking capacitors having a value in the approximate range of 490 microfarads (µF).

When large capacitors are utilized for DC blocking purposes, a substantial amount of time may be required to charge the capacitor to its operating potential when the circuit is first activated. If the charging current is not limited, there is a possibility that charging rate may exceed a voltage value that will cause an audible pop and click to be heard in the headphone.

For example, assuming that a 1 millivolt step change may cause a noticeable pop and click in the headphone, the maximum charge current step function allowed for a 16 Ohm load would be approximately 62 microamps (1 mV/16 Ohm=62 µA). That is, the charging current may be increased without being audible, but it should be incrementally increased (e.g. start at 62 µA, wait for a time period, increase current to 124 µA, wait for a time period, increase to 186 µA, etc.). Each step increase causes an approximate 1 mV initial step on the load, but then increases the charging ramp rate dV/dt=I/C. Assuming the use of a 490 µF capacitor and assuming that the capacitor would be charged to a voltage of around 1 Volt at the incrementally increased value of 62 µA, it would take approximately 7.6 seconds for the capacitor to be fully charged. This is a considerable amount of time to wait once the amplifier is initially powered. Many electronic devices that would employ a headphone, such as MP3 (MP3 is an audio standard under the Moving Picture Experts Group or MPEG) players, such lag time is not desirable, since the user would need to wait until the amplifier powers up to its operating level.

In order to ensure fairly short charge time of the blocking capacitor for audio applications, one technique uses a number of current sources at the output to charge the DC blocking capacitor to provide the incrementally increased current noted above. In this technique, additional current sources are switched in parallel to increase the charging current as the capacitor begins to charge. With each incremental current source switched in, the charging current is increased incrementally in a step function as explained above. Specific time intervals are designated for switching in the additional current(s) to reduce the time to fully charge the blocking capacitor, but at the same time to have an acceptable anti-pop (anti-click) performance.

A similar problem is encountered when the amplifier is powered down. The fully charged DC blocking capacitor now needs to discharge at a rate that should not cause a pop and click at the output. In order to obtain acceptable anti-pop (anti-click) performance for powering down the headphone, a decremental current response is typically obtained by switching in parallel resistors at specific time intervals.

A drawback of the current source-resistor switching in approach is that a number of current sources and resistors are employed with the output stage of the amplifier, adding extra circuit components to the amplifier. Furthermore, the incremental stepping-up of the current or the decremental stepping-down of the current is not continuous and may cause coarse granularity of the current adjustment to charge and discharge the DC blocking capacitor.

DETAILED DESCRIPTION OF THE EMBODIMENTS OF THE INVENTION

The embodiments of the present invention may be practiced in a variety of amplifiers, including those amplifiers that utilize a DC (direct current) blocking capacitor. In the following description, a particular audio amplifier is described driving a load, such as a low impedance load. An example of a low impedance audio load is a headphone (HP). The signal being coupled to the load is an audio signal, generally above 20 Hz. However, the embodiments of the invention may be employed and practiced in other types of amplifiers as well and not limited to the particular embodiments described below.

Figure 1:
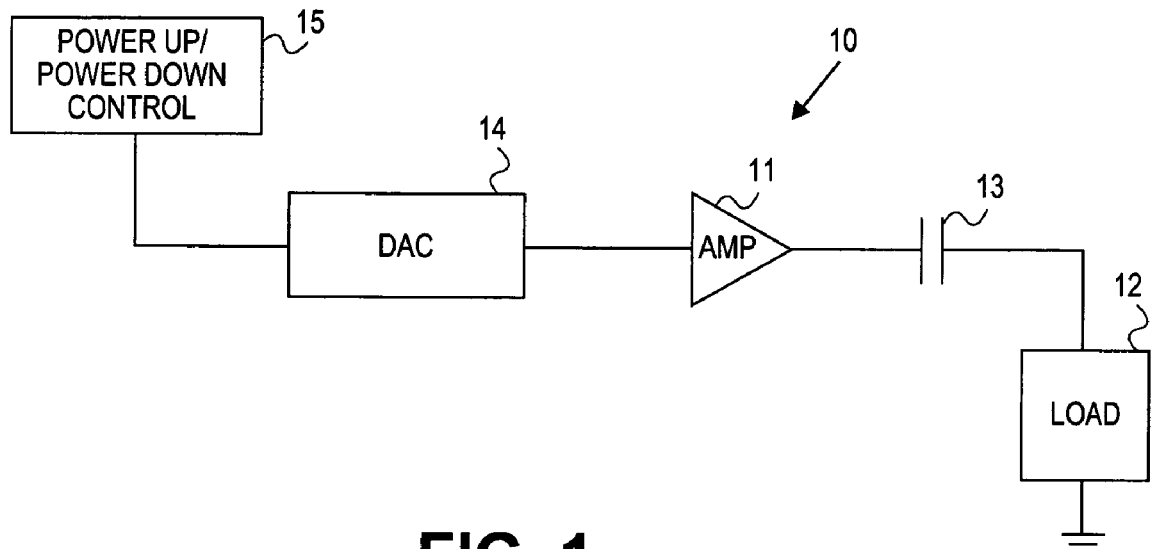
FIG. 1 is a block schematic diagram illustrating an embodiment of the invention in which a digital-to-analog converter is used to control the output of an amplifier to implement a powering up and powering down sequences that reduce pop and click response at a load.

Referring to FIG. 1, an example circuit 10 is shown in which an amplifier 11 is coupled to a load 12 through a DC blocking capacitor 13. In the particular embodiment of circuit 10, amplifier 11 may be used as an audio amplifier to drive an audio signal to a load 12, which may be a low impedance load. One example of a low impedance load is a headphone, which may have an impedance in the range of 16 Ohms. Since the output of the amplifier is sourced by a DC supply voltage (commonly referred to as rail voltage or rail) the DC blocking capacitor 13 is used to block this DC voltage from the load 12. Thus, only the audio signal is coupled from the amplifier 11 to the load 12. The amplifier 11 may have a gain factor of 1, less than 1, or greater than 1. In a typical audio headphone application, an analog audio signal is coupled to the input of the amplifier 11 and may be amplified and coupled to the load 12. As noted in the background section above, one typical example of an audio device utilizing circuit 10 is a MP3 player, in which audio signals are generated and output to a headphone for listening by the user.

In order to ensure that popping and/or clicking noises (pop and click) are not heard by the listener at powering up or powering down of an electronic device, a power up/power down control unit 15 is employed within circuit 10. The power up/power down control unit 15, which may be a circuit, generates digital signals which are input to a digital-to-analog converter (DAC) 14. The output of the DAC 14 is coupled to the input of the amplifier 11.

To ensure that the pop and click is not heard, the charging of the blocking capacitor 13 at powering up and the discharging of the capacitor 13 at powering down should be controlled and not exceed a rate that would cause the pop and click. The pop and click is used herein to refer to a condition when unwanted audio noise is heard by the listener. Typically, this unwanted noise has a popping and/or clicking sound. In order to control the charging/discharging rate of the capacitor 13, the power up/power down control unit 15 generates data and sends this data to the DAC 14 to control the output of the amplifier 11. Accordingly, by controlling the digital data input to DAC 14, DAC 14 drives the amplifier 11 to charge the capacitor 13. During the powering down sequence, control unit 15 sends data to DAC 14 to have amplifier 11 control the discharging of the capacitor 13.

An advantage of utilizing the DAC 14 to control the powering up and powering down sequence is that DAC 14 may be the same digital-to-analog converter utilized during normal operation of converting digital signal to audio signal for amplification by amplifier 11 to drive load 12. Employing one DAC for both functions allows power up and power down control capability without the addition of considerable extra circuitry in way of adding current sources and resistors at the output of amplifier 11 (for example, if the prior art techniques described in the background section were employed).

Figure 2:
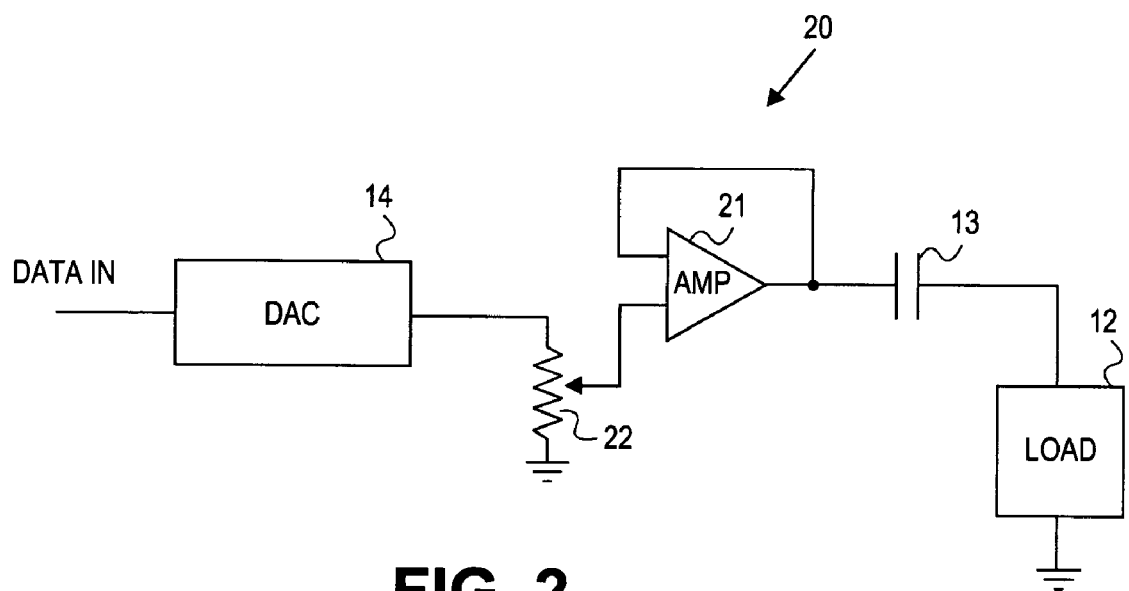
FIG. 2 illustrates a circuit diagram showing one embodiment of a single-ended amplifier implementation of the circuit of FIG. 1.
Figure 3:
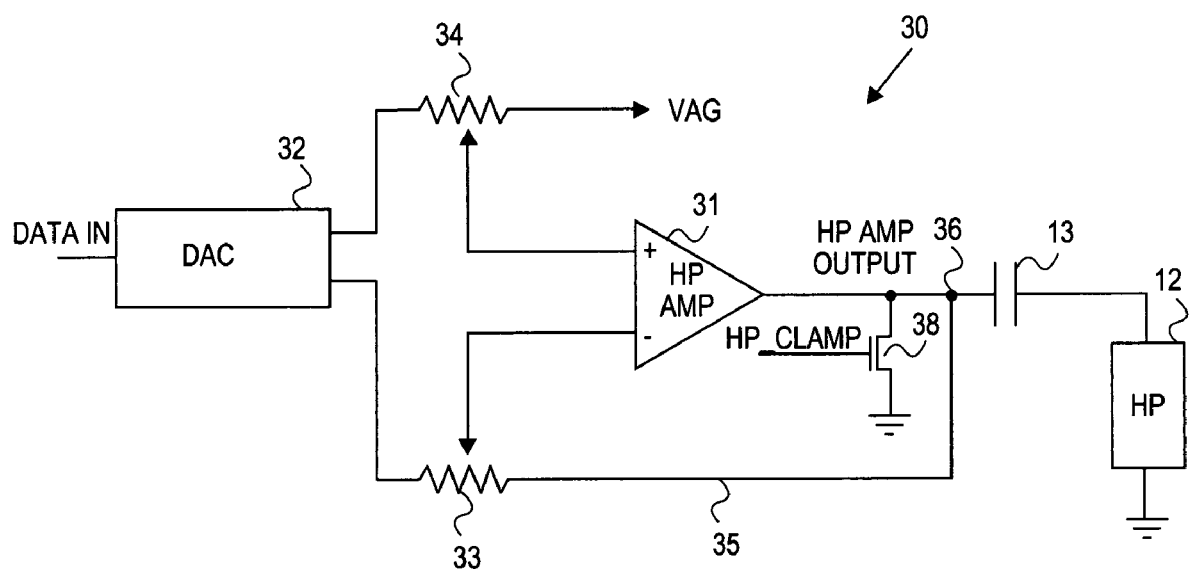
FIG. 3 illustrates a circuit diagram showing one embodiment of a differential amplifier with feedback implementation of the circuit of FIG. 1.

It is to be noted that the circuit 10 of FIG. 1 may be employed in various embodiments. Two example embodiments for implementing the scheme of FIG. 1 are shown in FIGS. 2 and 3. In FIG. 2, circuit 20 shows a single-ended amplifier arrangement in which a single-ended amplifier 21 may be coupled to load 12 through the DC blocking capacitor 13. In the particular circuit 20, the output of the amplifier 21 is shown coupled back as a feedback to a negative input of the amplifier 21. The output of the DAC 14 is coupled to a positive input of the amplifier 21 through a volume control component, which is shown as a variable resistor 22 in FIG. 2.

In circuit 20, digital audio signals (such as music, voice, etc.) are sent to the DAC 14 and converted to an analog signal for input to the amplifier 21. The same DAC 14 may be employed to receive power up and power down control signals during powering up and powering down sequences to drive amplifier 21. The signal-ended amplifier 20 receives power up signals during a powering up sequence which controls the output of the amplifier 21 to charge the capacitor 13 at a predetermined rate. Similarly, during the powering down sequence, DAC 14 receives power down control signals to discharge the capacitor 13 at a predetermined rate. The predetermined power up and/or power down rate that may be employed at the output of the amplifier 21, may take various forms and example embodiments are described below in reference to FIG. 4. It is to be noted that in the single-ended design of FIG. 2, there is no feedback path between the output of amplifier 21 and the input from the DAC 14. Also, the output may be clamped, as described below in reference to FIG. 3.

Referring to FIG. 3, an amplifier circuit 30 is shown in which a headphone (HP) amplifier 31 is coupled to a headphone 12 (load) through the DC blocking capacitor 13. Amplifier circuit 30 employs a differential design in which HP amplifier 31 is a differential amplifier. Accordingly, differential output from DAC 32 is coupled as differential inputs to amplifier 31 through corresponding set of volume control components, which are shown as variable resistors 33 and 34. As shown, DAC 32 is coupled to resistor 34 at one terminal, while the opposite terminal is coupled to an analog ground (VAG). However, the opposite terminal of resistor 33 is coupled to the output of amplifier 31. This design allows gain or attenuation and a differential to single-ended arrangement with a single amplifier.

Although the output may be differential as well, the particular example embodiment of the amplifier circuit 30, uses a single stage differential to single-ended amplifier design. Again, the input to DAC 32 is a digital signal which, when converted, is used to drive the amplifier 31. DAC 32 receives the power up and power down data, in order to control the powering up and powering down of the amplifier circuit 30 and to control the charging and discharging of the capacitor 13.

Unlike the single-ended input amplifier of FIG. 2, amplifier circuit 30 employs a feedback path 35 to one of the amplifier inputs that is coupled to the DAC. This feedback is to the negative input terminal of the amplifier 31. Because of this path 35, it is possible that unwanted voltages or signals may be coupled from the DAC to output node 36 of the amplifier 31 during one or both of the powering up/powering down sequences. In order to ensure that stray feed through along path 35 is prevented or at least reduced, a clamping switch 38 may be utilized at the output node 36 of amplifier 31. Generally, the feed through from the DAC 32 to the output node 36 may be noticeable when the amplifier 31 is not sufficiently powered and/or is in a high impedance state. The clamping switch 38, as shown by the transistor, couples node 36 to a clamped value. The clamped value is typically the power return of the circuit, which is ground in this instance.

Clamping the output node 36 to a steady value (such as ground potential), when the amplifier 31 is commencing to power up or has reached near a turn off state during a power down sequence, ensures that an unwanted signal through path 35 does not affect the output at node 36. It is to be noted that a variety of devices or switches may be employed for the clamping of the node 36. In the particular embodiment shown, a transistor is employed as the clamping switch 38 to clamp node 36 to ground. The gate of transistor is driven by a control signal (shown as HP_CLAMP). The HP_CLAMP signal may be generated at a variety of locations and in one embodiment it is generated by the power up/power down control unit 15 (shown in FIG. 1).

Figure 6:
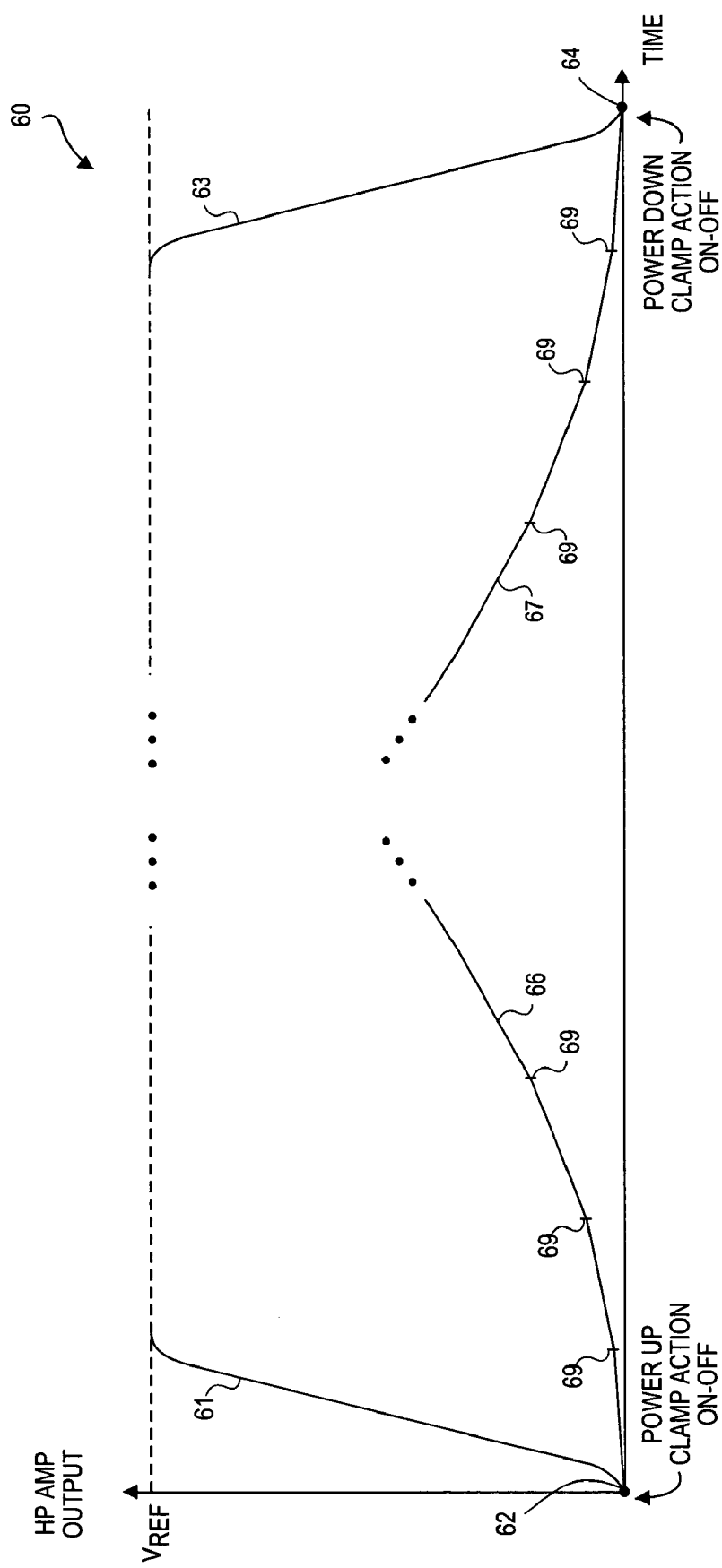
FIG. 6 is a waveform diagram showing an embodiment of an amplifier output ramp rate for use in powering up or powering down.
Figure 7:
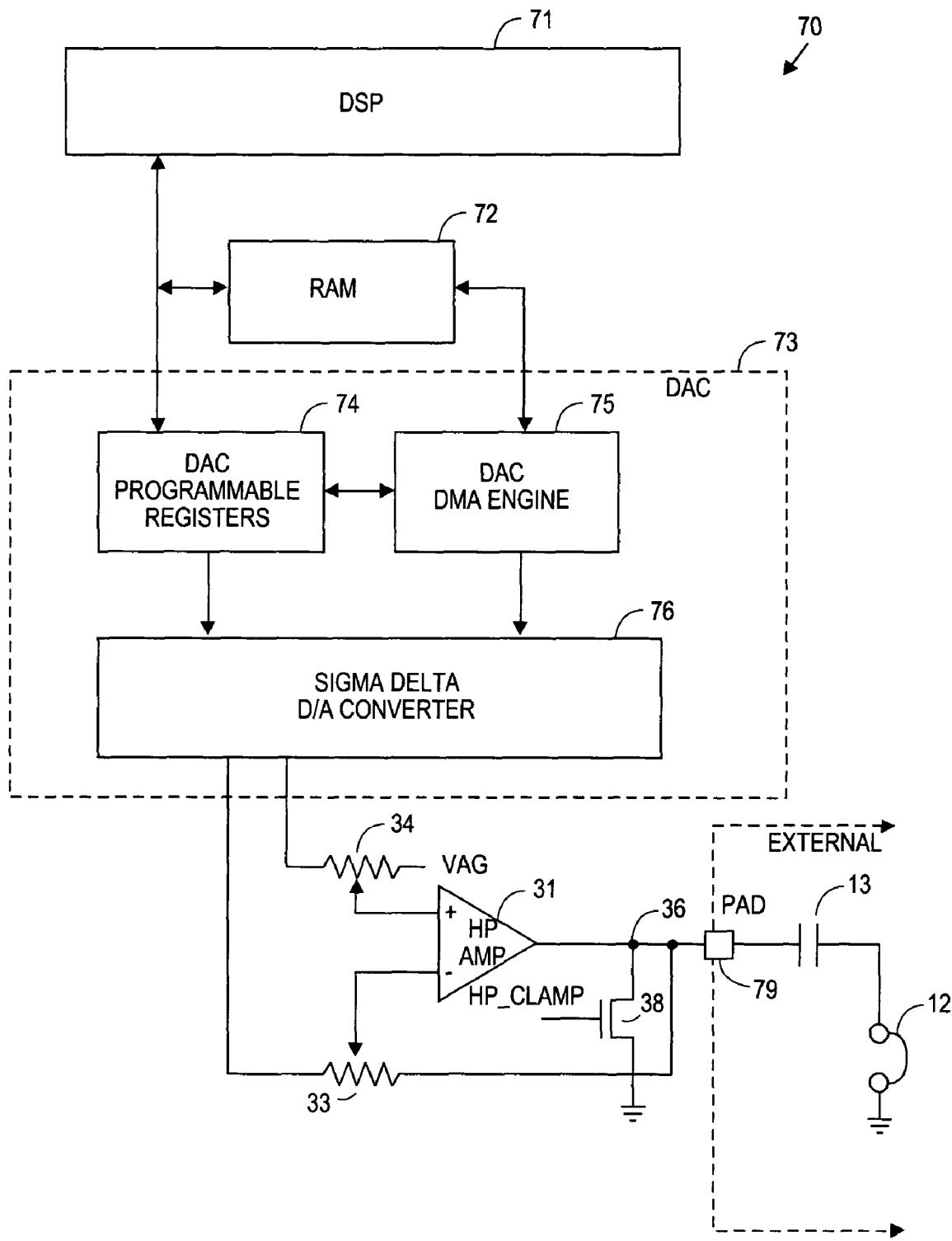
FIG. 7 is a block schematic diagram showing an embodiment in which the differential amplifier circuit of FIG. 3 operates with a digital signal processor to control the output of the amplifier.

As will be further explained in the flow diagrams of FIGS. 6 and 7, the clamping switch 38 clamps node 36 to ground when capacitor 13 begins to charge during a powering up sequence. Clamping node 36 to ground when the amplifier 31 is still off, ensures that the capacitor 13 is at the clamped value (ground) and most likely not affected by feed through along path 35. Furthermore, the clamp action may be employed in various other circuits, including the circuit shown in FIG. 2.

Figure 4:
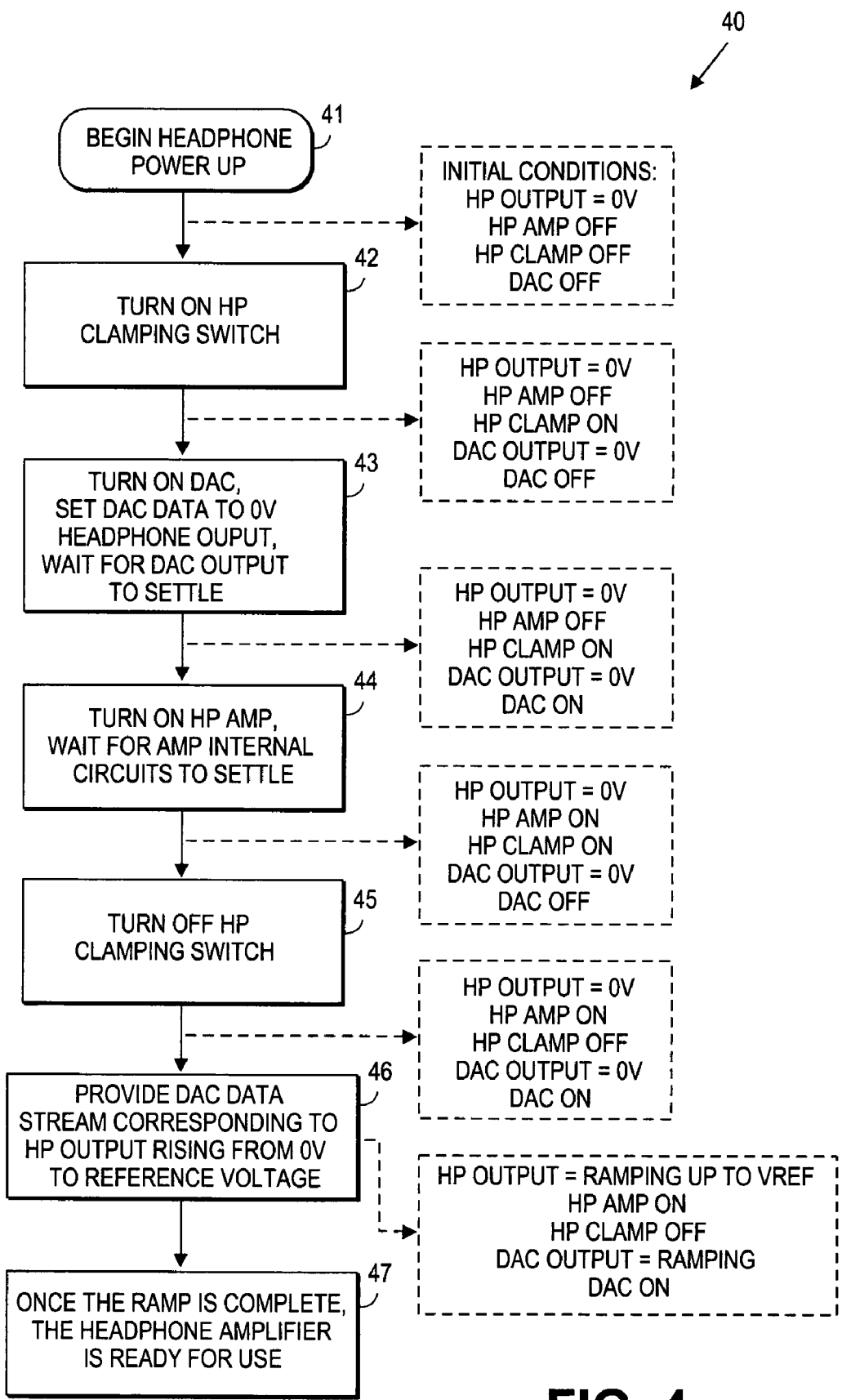
FIG. 4 illustrates a flow diagram showing one embodiment of implementing a powering up sequence in which a clamping switch may be used to clamp the output node of the amplifier.

Referring to FIG. 4, flow diagram 40 exemplifies one embodiment for operating an amplifier circuit (such as amplifier circuit 30) during a headphone powering up sequence. The flow diagram 40 may be understood better when taken in conjunction with the amplifier circuit 30 of FIG. 3. A headphone powering up sequence begins (block 41) when power up initialization commences. An example of a power up initialization is when a device, such as a MP3 player, is turned on. The initial conditions of the amplifier circuit are noted as follows. The HP amplifier (such as amplifier 31) is off, the HP clamping device (such as switch 38) is off and the DAC (such as DAC 32) is also off. That is, at initialization where power is first being applied the HP amplifier and the DAC are still off and the clamping switch is off as well. The voltage at the HP amplifier output (such as node 36) is at 0 volts. Subsequently, the clamping switch is turned on (block 42) to ensure that the output node is clamped to ground. After the output node is clamped to ground, the DAC may be turned on. The DAC data input (such as from the power up/power down control unit) sets the DAC output to it's maximum negative level (block 43). Thus, at this stage the DAC is on, however the headphone amp is off. The DAC output drives the HP amplifier input to it's lowest level before turning on the HP amplifier.

Once the DAC output settles then the HP amp may be turned on (block 44). Once the HP amplifier's internal circuitry has settled, the HP amplifier is now ready to commence the charging operation of a blocking capacitor (such as capacitor 13). At this state, the clamping switch is turned off (block 45). Once the clamp is removed from the output node, the power up/power down control unit sends to the DAC data stream corresponding to the ramping of the voltage at the output node. The ramping voltage is from 0 volts to some reference voltage value ($V_{REF}$) which may be determined as a normal operating level voltage for the blocking capacitor.

In one embodiment, the capacitor 13 may be charged to one-half of the supply rail voltage so that substantially equal positive and negative headroom may be available for the AC component being coupled to the headphone (block 46). The data input to the DAC controls the amplifier output to provide a ramping voltage to charge the blocking capacitor to the predetermined reference voltage $V_{REF}$ (for example, to one-half VDD). Then, once the ramping is substantially complete, the headphone and the HP amplifier are ready for use (block 47) at which state the DAC receives normal audio signals, instead of the initialization start-up data from the power up/power down control unit.

Figure 5:
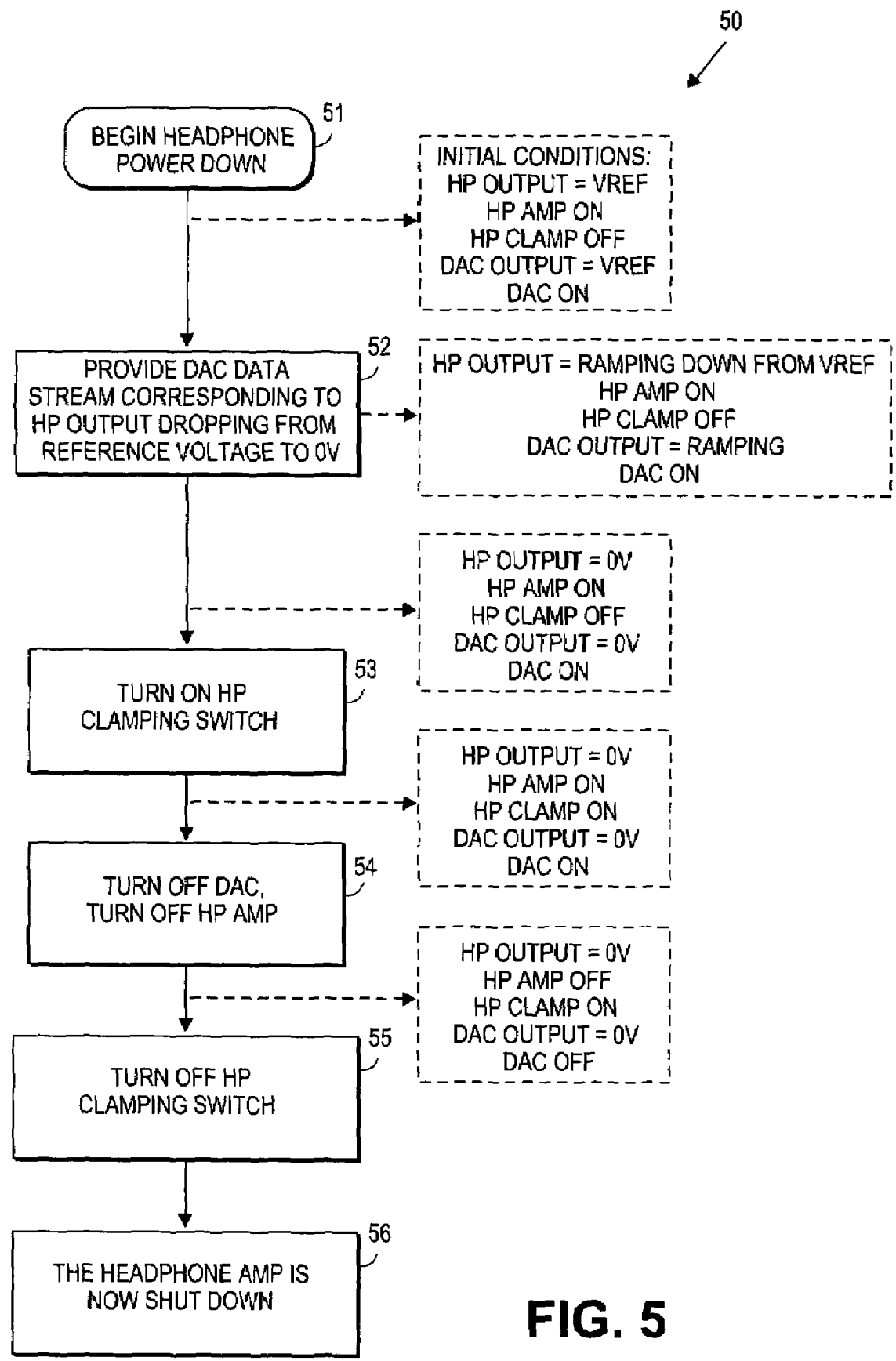
FIG. 5 illustrates a flow diagram showing one embodiment of implementing a powering down sequence in which a clamping switch may be used to clamp the output node of the amplifier.

Referring to FIG. 5, diagram 50 shows a powering down sequence, which may be understood better when referenced to FIG. 3. The powering down sequence shown in FIG. 5 follows a sequence substantially the reverse of the powering up sequence of FIG. 4. As noted, the power downing sequence commences when some action, such as turning off the MP3 player, begins the headphone power down to commence (block 51). The initial conditions of the headphone unit prior to power down is its normal operating condition. That is, the output of the HP amplifier is at a DC value of $V_{REF}$. The HP amplifier is on, the clamping switch is off and the DAC is on and its output is placed to the $V_{REF}$ value by the power up and power down control unit. Once the DAC is initialized to the $V_{REF}$ value the DAC commences to ramp down at the rate determined by the data provided from the power up/power down control unit (block 52).

As the power down control unit takes control of the DAC input, the DAC ensures that the output of the HP amplifier begins to decrease in voltage from $V_{REF}$ toward 0 volts at the predetermined ramp down rate. When the DAC output reaches designated lower value, the clamping switch may be turned on to clamp node 36 to ground (block 53). Once the clamping switch is activated, then the DAC and the HP amplifier may be turned off as the supply voltage is turned off from these units. Spurious signals that may transition to the output node of the HP amplifier may be prevented or reduced from affecting the output, due to the clamping action. Once the HP amplifier and the DAC are substantially turned off the clamping switch may then be opened (block 55) since the HP amplifier is now shut down (block 56). Thus, the circuit may be powered down at a specified discharge rate for the capacitor. Once the output node voltage reaches a sufficiently low value, the clamping of the output node to ground ensures that spurious signals coupling is prevented or at least reduced.

It is to be noted that in some embodiments the clamping switch may not be employed, even if there is a feedback path. In some circuits the feed through may be insubstantial that the clamping operation may not be needed. What is to be employed is the use of the DAC to control the output of the amplifier to ensure that the charging and/or discharging rate of the DC blocking capacitor is maintained at a sufficient rate, but not overly aggressive, so that popping and clicking noise are not heard at the load during powering up and powering down sequences. Furthermore, it would make sense to employ the ramping control at both power up and power down. However, in some embodiments the pop and click reduction may be employed only for power up or only for power down. In other embodiments, both sequences would be utilized.

As noted above, the charging and discharging rate of the capacitor due to the output of the amplifier may be controlled by the data stream from the DAC. The DAC receives the data from a power up/power down control unit. Thus, the charging and discharging characteristic of the capacitor may take a variety of shapes and may be programmable. In one embodiment, the charge and discharge characteristic is a substantially linear curve which does not exceed a range of frequencies which would not make it audible. The charge/discharge characteristic curve need not be linear and may take other forms such as an exponential curve, provided that the curve characteristic is such that the frequency is below the audible range. Thus, the charge and discharge rate of the output DC blocking capacitor in one embodiment is below 20 Hz. In another embodiment, the slope of the curve is maintained below 10 Hz.

Referring to FIG. 6, an example embodiment illustrating a ramping of the voltage at the output of the HP amplifier at power up initialization and the ramping response at power down is illustrated in graph 60. As disclosed above, the ramp rate at the output of the HP amplifier is controlled by the signal output from the DAC, which drives the HP amplifier. The leading edge 61 illustrates one embodiment for ramping the voltage until it reaches the specified steady state value noted herein as the reference voltage $V_{REF}$. The ramp rate from 0 volts to $V_{REF}$ is controlled by the data input to the DAC so that the slope of the curve 61 does not exceed the audible frequency range. As noted above, in one particular embodiment, the slope of the curve is maintained below 20 Hz and in another embodiment the slope of the curve is maintained below 10 Hz. Curve 61 is substantially linear, however, as noted previously the slope may take other characteristics which are nonlinear. Thus, the power up ramp rate may be exponential.

If a clamping switch is utilized (for example if curve 60 is utilized for the circuit of FIG. 3) then the clamping action pursuant to the flow chart 40 of FIG. 4 is implemented at the commencement of the power up sequence as noted by point 62 on curve 61.

Similarly, the power down ramping rate is exemplified by the trailing slope 63 for the curve 60. Again, the downward slope of the curve maintains a value which keeps the frequency response of the curve below the audible range. Again, although a linear curve is shown for the trailing edge 62, the response may be nonlinear, such as exponential. Similarly, if a clamping switch is utilized in the circuit (such as circuit 30 of FIG. 3), then the clamping action occurs at point 64 along curve 63.

Furthermore, a charging current curve 66 and 67 are shown in FIG. 6 to exemplify the use of an incremental current stepping function known in the prior art and discussed in the Background section above. As described in the background section above, if multiple current sources were incrementally switched in at the output of an amplifier to control the ramping during the powering up sequence, current curve function 66 exemplifies one example current response as additional current sources are switched in. Typically, when the charging current is stepped up, it causes a very small initial voltage step and then ramps the capacitor voltage according to I=C dV/dt. As other current sources are switched in, there is an additional small voltage step and the dV/dt charging rate increases according to I/C.

Similarly, current curve 67 exemplifies one embodiment known in a prior art when stepping resistors are switched in to ramp down the output a powering down sequence. The power down resistance steps also cause a small initial voltage step and then ramp down with a typical RC time constant. As noted in FIG. 6, stepping discontinuities 69 in the current curves 66, 67 employing prior art techniques, result from the switching in of corresponding current sources/resistors. As noted in graph 60, ramping curve 61 and ramping curve 63 are substantially continuous and this continuity is achieved since the DAC is capable of sustaining a substantially continuous slope due to DAC's ability to handle the smaller granularity of voltage changes.

The various embodiments described above as well as other embodiments employing the invention may be implemented in a variety of circuits and applications. FIG. 7 shows one embodiment for employing the amplifier of FIG. 3.

Referring to FIG. 7, a circuit 70 is shown implemented on an integrated circuit (IC) chip, in which the IC drives an external component(s) In this example, the capacitor 13 and headphone 12 may be located off chip. The amplifier output form the IC occurs at terminal 79, which may be a pad on the IC. The external components of capacitor 13 and headphone 12 are shown coupled to terminal 79. In the example circuit of FIG. 7, the HP amplifier employed is equivalent to the amplifier circuit shown in FIG. 3. That is, a differential amplifier is shown in which a feedback path exists between the output of the amplifier 31 and an input of the amplifier.

The DAC for driving the amplifier 31 is shown as DAC 73 in FIG. 7. DAC 73 includes a set of programmable registers 74 and a DMA (direct memory access) engine 75, as well as a Sigma Delta unit 76 to provide the Sigma Delta A/D conversion. Sigma Delta techniques for converting digital-to-analog signals is known in a variety of Sigma Delta D/A converters. Such a Sigma Delta D/A converter may be utilized for the Sigma Delta converter 76.

A digital signal processing unit (DSP) 71 is coupled to the DAC 73. A memory unit such as random access memory (RAM) 72 is also coupled to the DSP 71 and DAC 73. The DSP 71 generally provides a digital data stream to the DAC 73 to control the output from HP amplifier 31. In normal operation, the data stream from DSP 71 may be a signal in the audio range, such as voice or music. The RAM 72 may be utilized as the storage unit for the transfer of data between the DSP 71 and the DAC 73. The Sigma Delta converter unit 76 responds to commands issued by the DSP 71 and the programming of DAC 73 is controlled by the instructions received into the DAC programmable registers 74. The DMA engine 75 may be utilized to access the RAM 72 to retrieve data under control of the programmable registers 74.

Thus, under normal operation digital audio signals are transferred from the DSP 71 to a DAC 73 and converted to differential analog signals for input into the headphone amplifier 31. As noted above in description of FIG. 3, amplifier 31 may provide a gain of 1 or higher and generates an audio output for coupling to the headphone 12 through terminal 79. However, during the powering up sequence, DSP 71 issues commands to the DAC 73 to accept a data stream which ramps the output node 36 in accordance with a ramping characteristic which prevents or reduces the pop and click at the headphone 12. One such ramping response for the power up sequence may follow the response of curve 61 of FIG. 6.

Similarly, during a powering down sequence, DSP 71 issues commands to the DAC programmable registers 74 to receive a data stream which directs the ramping down of the voltage at node 36. Again, curve 63 of FIG. 6 shows one embodiment for employing the ramp down of node 36. Also shown in FIG. 7 is the switch 38 which if implemented clamps node 36 at the initialization of the powering up sequence or at the tail end of the powering down sequence. As noted, one embodiment for powering up and one for powering down are illustrated in the respective flow diagrams 40 and 50 of FIGS. 4 and 5. Thus, FIG. 7 illustrates one embodiment of utilizing the invention in which a DAC is controlled by a DSP to generate appropriate ramp up voltage or ramp down voltages at node 36 of the amplifier 31.

Figure 8:
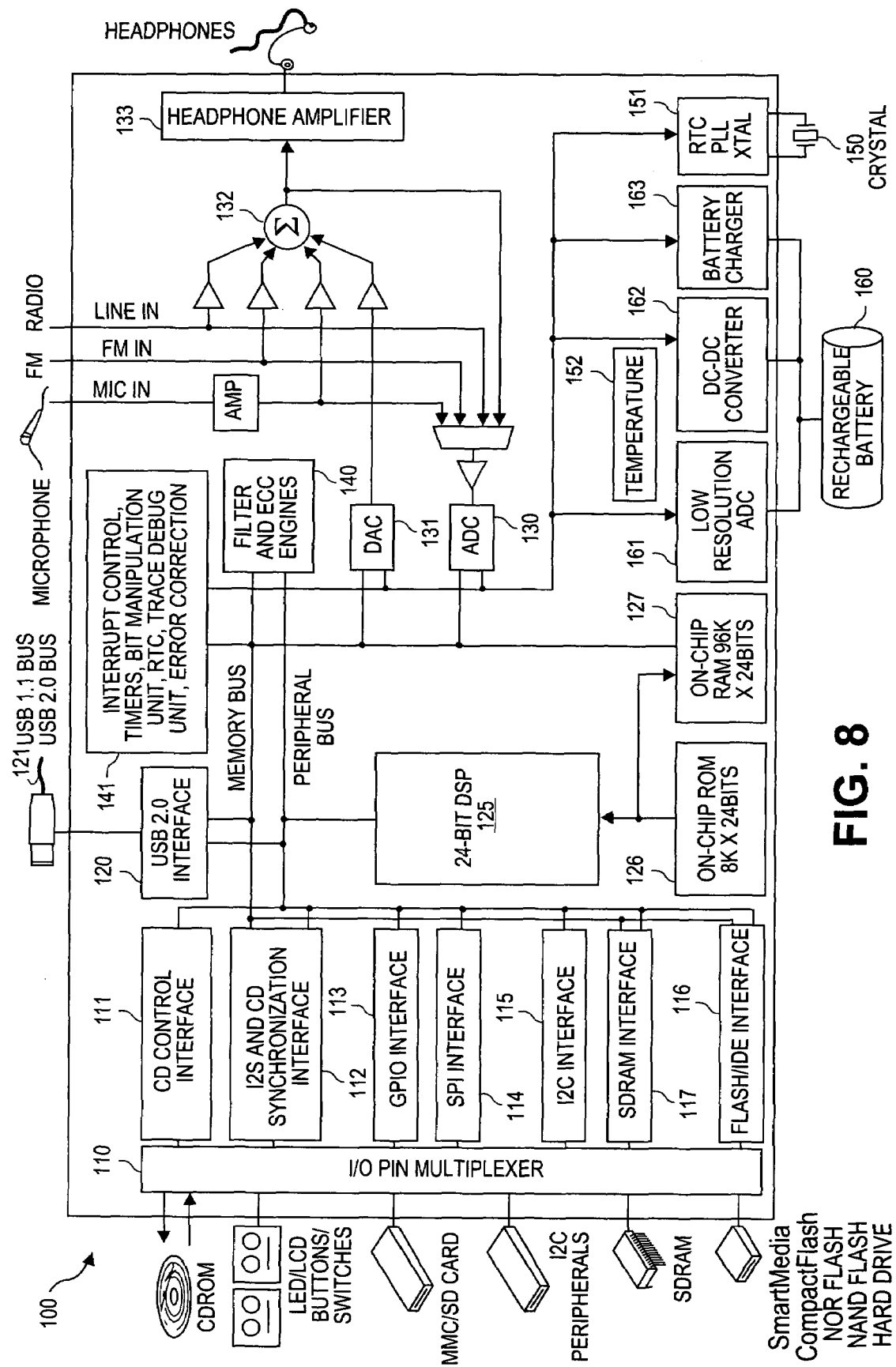
FIG. 8 is a block schematic diagram of an example integrated circuit chip operating as an audio system-on-a-chip and employing the powering up and powering down sequence which reduces pop and click at the output.

It is to be noted that various embodiments of the invention may be employed in a variety of IC chips. One example embodiment is illustrated in FIG. 8. In FIG. 8, an example integrated circuit (IC) 100 is shown in which one embodiment of the invention is implemented within IC 100. The example IC 100 is a single IC chip that implements a complete audio system. It is to be noted that the example embodiment of FIG. 8 implements a complete audio system on a single chip, but other embodiments of the invention may incorporate one or more integrated circuit chips to provide a complete system or parts of a system.

As illustrated in FIG. 8, a variety of blocks are noted within the confines of IC 100. The various blocks exemplify hardware components, software and interfaces resident within IC 100. The example audio system of IC 100 may operate with one or a variety of devices, as illustrated in FIG. 8. Accordingly, a CD (compact disc); LED (Light Emitting Diode)/LCD (Liquid Crystal Display) displays, buttons and/or switches; MMC (Multimedia Card)/SD (Secure Digital) cards; I2C peripherals; SmartMedia, Compact Flash, NOR Flash, NAND Flash, and/or hard drive devices; and memory, such as SDRAM (Synchronized Dynamic Random Access Memory) are some components that may be coupled to IC 100 through an I/O (input/output) pin multiplexer 110, as is illustrated in FIG. 8. These various multiplexed connections are coupled to respective interfaces. These interfaces include CD control interface 111; I2S and CD synchronization interface 112; GPIO (General Purpose Input/Output) interface 113, SPI (Serial Peripheral Interface) interface 114; I2C interface 115; Flash/IDE (Integrated Device Electronics) interface 116; and SDRAM (synchronous dynamic random access memory) interface 117.

Furthermore, a USB 2.0 interface 120 allows the coupling of a USB connection external to the IC 100. In the particular embodiment shown, USB 2.0 interface 120 is compatible with the USB 2.0 and backward compatible to a USB 1.1 protocol. A microphone input, radio input and a line input are also available on IC 100 to allow interconnection to a microphone, radio, or other audio input.

The core of IC 100 is a DSP (Digital Signal Processor) 125, which in this embodiment is a 24-bit DSP. An on-chip ROM (Read Only Memory) 126 and an on-chip RAM (Random Access Memory) 127 operate as memory for DSP 125. An analog-to-digital converter (ADC) 130 allows for analog inputs to be converted to digital format for processing by DSP 125. Similarly, a digital-to-analog converter (DAC) 131 is present to convert digital signals to analog signals for output in analog form. In this instance, amplified signals through a summation node 132 and headphone amplifier 133 generate an amplified analog signal output external to IC 100. For example, the analog output may be operably coupled to a set of headphones. Also included within IC 100 is a filter and ECC (Error Correction Circuit) engines 140 to provide filtering and error correction operations. Other functions are shown within block 141 to provide various control and timing functions. These may include Interrupt Control, Timers, Bit Manipulation Unit, Real Time Clock (RTC), Trace Debug Unit, and error correction just to name a few of the operations.

Also within IC 100 is a RTC PLL (Real Time Clock/Phase Locked loop circuit 151, which is coupled to an external crystal 150 to provide an accurate clocking signal for circuits of IC 100. Memory and peripheral buses are also present within IC 100 for transfer of data and signals. A temperature sensor circuit 152 is present to monitor the temperature of the IC 100.

In FIG. 8, a rechargeable battery 160 is shown coupled to a low resolution ADC 161, DC-DC converter 162 and battery charger 163. ADC 161 monitors the battery voltage to determine if the battery voltage is such that the battery requires charging or if the battery is fully charged. ADC 161 may also monitor the battery voltage to determine if a battery is present. Thus, if the battery is not present or is removed during use, IC 100 detects the absence of the battery through the monitoring provided by ADC 161. The DC-DC converter 162 converts the battery voltage to an operative voltage utilized by components of the IC 100. Battery charger 163 is utilized to charge the battery when an external voltage source is coupled to the IC 100.

A variety of batteries may be utilized for battery 160 and, as noted above, battery 160 is a rechargeable battery. In one particular embodiment, the rechargeable battery is a Nickel Metal Hydride (NiMH) battery. It is to be noted that various other batteries may be utilized, including alkaline cells and lithium ion (LiON) batteries. Generally, battery 160 provides a voltage in the range of 0.9 to 3.6 volts to IC 100. In the instance where a NiMH battery is used, the typical range is 0.9 to 1.25 volts. Since the voltage from the battery may vary, and/or the circuitry may require voltages other than what is provided by the battery, the DC-DC converter 162 provides conversion of the battery voltage to one or more voltages utilized on IC 100. In some embodiments, converter 162 may provide more than one DC conversion from the battery. For example, in one embodiment a NiMH battery of 0.9 to 1.25 volts may provide nominal chip voltage of 3.3 volts to the load. In another a combination of 3.3 volts and 1.8 volts are provided to the load.

The IC 100 is designed to also operate from other external power sources, when such power sources are coupled to the IC 100. One of the power sources may be provided through the USB 2.0 interface 120. The USB 2.0 protocol specifies the transfer of data by the use of differential data lines through a USB link, such as bus 121. The data is generally provided on a differential lines (D+ and D−lines). The USB 2.0 protocol also specifies the presence of a +5 volt DC voltage through bus 121 through VBUS and ground (GND) connections. Thus, an external power source having a voltage of +5 volts may be used as a power source for IC 100 through the USB 2.0 interface 120 when bus 121 is coupled to IC 100. In this instance, a USB host provides the 5 volts, while IC 100 operates as a USB device coupled to the USB host. IC 100 then may use the 5 volts to power components or circuitry on IC 100 provided the various USB specification requirements are met. In the particular embodiment of FIG. 5, when bus 121 is coupled to IC 100, the 5 volts from the USB host powers the internal circuitry, instead of the battery 160. The charger 163 uses the 5 volts from the USB host to also charge the battery 160.

In this example embodiment, the above-described DAC and the amplifier that implement the powering up and powering down may be performed by the DAC 131 and headphone amplifier 133. The DSP 125 generates the data that controls the ramp rate for the output of DAC 131 and amplifier 133, Thus, pop and click reduction using DAC power up and power down processing is described.

We claim:

1. An apparatus comprising:
   an audio amplifier to generate an output to an audio load;
   a digital-to-analog converter to drive the audio amplifier during at least one of powering up and powering down the audio amplifier, the digital-to-analog converter to control the audio amplifier to ramp the voltage at the output at a predetermined rate to reduce audio pop and click from being heard at the load during the at least one of powering up or powering down of the audio amplifier;
   a control circuit to generate data sent to the digital-to-analog converter during at least one of powering up and powering down the audio amplifier; and
   a clamping switch at the output of the amplifier to selectively clamp the output of the amplifier to a power return potential, wherein the clamping switch is on to clamp the output to the return potential during initiation of a powering up sequence and the clamping switch is off when the audio amplifier and the digital-to-analog converter are substantially turned on.

2. The apparatus of claim 1 wherein the data from the control circuit ramps the voltage at a ramp rate below frequency heard at the load.

3. The apparatus of claim 1 wherein the clamping switch is turned on to clamp the output to the return potential at initiation of a powering down sequence.

4. The apparatus of claim 3 wherein the data from the control circuit ramps the voltage at a ramp rate below frequency heard at the load.

5. A method to power up or power down an audio amplifier comprises:
   sending digital data for digital-to-analog conversion during a powering up or powering down of an audio amplifier, which generates an output to an audio load;
   converting the digital data to drive the audio amplifier;
   clamping of an output node of the audio amplifier to a power return potential during initiation of a powering up sequence and turning off the clamping when the audio amplifier and the digital-to-analog converter are substantially turned on; and
   using the converted digital data to control the ramping of the voltage at the output to not exceed a predetermined rate to reduce audio pop and click from being heard at the load during the powering up or powering down of the audio amplifier.

6. The method of claim 5 further comprises ramping the voltage at the output to a steady-state reference value at the predetermined rate during the powering up of the audio amplifier.

7. The method of claim 6 wherein using the converted digital data controls the ramping of to voltage to a ramp rate below frequency heard at the load.

8. The method of claim 5 further comprises ramping the voltage at the output from a steady-state reference value at the predetermined rate during the powering down of the audio amplifier.

9. The method of claim 8 wherein using the converted digital data controls the ramping of the voltage to a ramp rate below frequency heard at the load.

10. An integrated circuit comprising:
    an audio amplifier to generate an analog output to am audio load, when the audio load is operably coupled to the integrated circuit;
    a digital-to-analog converter to drive the audio amplifier during at least one of powering up and powering down the audio amplifier, the digital-to-analog converter to control the audio amplifier to ramp the voltage at the output at a predetermined rate to reduce audio pop and click from being heard at the load during the at least one of powering up or powering down of the audio amplifier;
    a control circuit to generate data sent to the digital-to-analog converter during at least one of powering up and powering down the audio amplifier; and
    a clamping switch at the output of the amplifier to selectively clamp the output of the amplifier to a power return potential, wherein the clamping switch is turned on to clamp the analog output to the power return potential during initiation of a powering down sequence and wherein the clamping switch is turned off when the audio amplifier and the digital-to-analog converter are substantially turned on.

11. The integrated circuit of claim 10 wherein the control circuit is a digital signal processor.

12. An apparatus comprising:
    an amplifier to generate an output to a load;
    a digital-to-analog converter to drive the amplifier during at least one of powering up and of powering down the amplifier, the digital-to-analog converter to control the amplifier to ramp the voltage at the output at a predetermined rate to reduce rapid voltage changes from being sent to the load during the at least one of powering up or powering down of the amplifier; and
    a clamping switch at the output of the amplifier to selectively clamp the output of the amplifier to a power return potential wherein the clamping switch is turned on to clamp the output to the power return potential during initiation of a powering down sequence and wherein the clamping switch is turned off when the audio amplifier and the digital-to-analog converter are substantially turned on.

13. The apparatus of claim 12 wherein the output of the amplifier to the load is through a blocking capacitor, the digital-to-analog converter to control the ramp of the voltage at the output to a least one of charging the blocking capacitor to a steady-state reference value at the predetermined rate and of discharging the blocking capacitor from the steady-state reference value at the predetermined rate.

14. The apparatus of claim 13 wherein the amplifier to generate an audio output to the load in which the at least one of powering up and powering down at the predetermined rate reduces audio pop and click at the load.

15. The apparatus of claim 12 further comprises a control circuit to generate data sent to the digital-to-analog converter during at least one of powering up and powering down the amplifier.

16. The apparatus of claim 15 wherein the data from the control circuit ramps the voltage at a substantially linear ramp rate.

* * * * *